US008415996B1

(12) United States Patent
Wong (10) Patent No.: US 8,415,996 B1
(45) Date of Patent: Apr. 9, 2013

(54) CLOCK PHASE CORRECTOR (75) Inventor: Wai Tat Wong, Bukit Mertajam (MY)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 13/167,956

(22) Filed: Jun. 24, 2011

(51) Int. Cl.
*H03L 7/00* (2006.01)

(52) U.S. Cl. .................................. 327/152; 327/237

(58) Field of Classification Search .................. None
See application file for complete search history.

(56) References Cited

U.S. PATENT DOCUMENTS

| 4,405,895 A * | 9/1983 | Gerst et al. | 324/76.82 |
| 4,829,257 A * | 5/1989 | Cooper | 327/237 |
| 6,288,517 B1 * | 9/2001 | Parker et al. | 318/811 |
| 6,777,994 B2 * | 8/2004 | Chou et al. | 327/269 |
| 7,315,219 B2 * | 1/2008 | Chiang | 331/57 |

* cited by examiner

*Primary Examiner* — Cassandra Cox
(74) *Attorney, Agent, or Firm* — Womble Carlyle Sandridge & Rice, LLP (57) ABSTRACT

Methods, circuits, and apparatus for correcting the phase of a clock signal are presented. In one method, an operation is included for receiving, from a plurality of input lines, a plurality of input clock signals with respective input clock phases. The input clock phases form an ordered sequence of clock phases. The method further includes an operation for transmitting, over a plurality of output lines, a plurality of output clock signals with respective output clock phases. The input and output lines are coupled to a serially coupled ring of resistors, where each resistor in the ring has a terminal coupled to an input line and the other terminal coupled to an output line. Further, each output clock phase has a value that is between successive input clock phases of the ordered sequence of clock phases.

20 Claims, 7 Drawing Sheets

CLOCK PHASE CORRECTOR

BACKGROUND

Many electronic systems use internal clocks which are required to be phase-aligned with an external reference clock, such as the clock embedded in an asynchronous incoming data stream. Phase alignment is important for data to be exchanged reliably between circuits. Clock signals are often provided by Phase-Locked Loop (PLL) circuitry on programmable logic devices, and the PLL circuits produce output signals that are continually adjusted to maintain a constant frequency and a constant phase relationship with an input reference signal.

A multiple-phase clock system provides multiple signals, each signal with a different phase, that can be used to alternately enable and disable circuits. In a multiple-phase clock system, functions involving more than one operation may be completed during a given clock cycle. However, if the clock signals have phase errors, the operations performed using the off-phase clock signals may fail due to a timing error. Unfortunately, some architectures assume that the input clocks are exactly 90° phase shifted from each other.

Possible causes for clock phase spacing error include device random mismatch, routing mismatch, and imbalanced clock loading. Most high-speed clock buffers use short channel length devices for speed. Since device random variation is inversely proportional to device gate area, the device matching between clock buffers is negatively affected. Further, for multi-gigahertz clock routings, both resistance and capacitance are important in order to match clock propagation delays, and any imperfection in the process will create clock phase spacing errors. In addition, top level metal routing can cause mismatches on clock routings. If there are unused clock phases, dummy loads need to be added to match the loading. Unfortunately, dummy loads cannot mimic the active load completely since dummy clock paths are usually disabled to save power.

Polyphase filters, also called I/Q generators, have been used to address clock phase spacing error issues. Polyphase filters, however, suffer from their narrow correction bandwidths. In addition, polyphase filters are not practical for low frequency applications due to the large floating capacitors needed in the filters.

It is in this context that embodiments arise.

SUMMARY

Embodiments provide methods, circuits, and apparatus for correcting the phase of a clock signal. It should be appreciated that the present embodiments can be implemented in numerous ways, such as a process, an apparatus, a system, a device or a method on a computer readable medium. Several inventive embodiments are described below.

In one embodiment of a method, an operation is included for receiving, from a plurality of input lines, a plurality of input clock signals with respective input clock phases. The input clock phases form an ordered sequence of clock phases. The method includes another operation for transmitting, over a plurality of output lines, a plurality of output clock signals with respective output clock phases. The input and output lines are coupled to a serially coupled ring of resistors, where each resistor in the ring has a terminal coupled to an input line and the other terminal coupled to an output line. Further, each output clock phase has a value that is between successive input clock phases of the ordered sequence of clock phases.

In another embodiment, a circuit for correcting the phase of a clock signal is provided. The circuit includes a plurality of input lines, a plurality of output lines, and a plurality of resistors. The plurality of input lines is operable to transmit a plurality input clock signals having respective input clock phases, the input clock phases forming an ordered sequence of clock phases. In addition, the plurality of output lines are operable to transmit a plurality of output clock signals that have respective output clock phases. The plurality of resistors is coupled serially and the resistors form a ring, where each resistor has a first terminal coupled to an input line and a second terminal coupled to an output line. Further, each output clock phase has a value that is between successive input clock phases of the ordered sequence of clock phases.

In yet another embodiment, a circuit for correcting a phase of a clock signal is provided. The circuit includes multiple input lines, multiple output lines, and multiple resistors. The multiple input lines are operable to receive multiple input clock signals with input clock phase values that are sequential and equally spaced apart within the sequence. The multiple output lines are operable to transmit multiple output clock signals with respective output clock phase values. Further, the multiple resistors are coupled serially and form a ring, where each resistor has a terminal coupled to an input line and the other terminal coupled to an output line. Each output clock phase value has a value between successive input clock phase values of the sequence. Each output clock phase value is defined to be different in phase from the corresponding input clock phase value.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe methods, circuits, and apparatus for correcting the phase of a clock signal. In one embodiment, eight resistors of equal size are connected as a ring. The terminals of the resistors are connected to inputs and outputs in alternate fashion. Generally speaking, the clock phase spacing error from two adjacent clock signals is averaged out, and the error is distributed to other clock phases, if necessary. This reduces the clock phase spacing error for every pair of clock signals.

It will be apparent that the present embodiments may be practiced without some or all of these specific details. In other instances, well known process operations have not been described in detail in order not to unnecessarily obscure the present embodiments.

Figure 1:
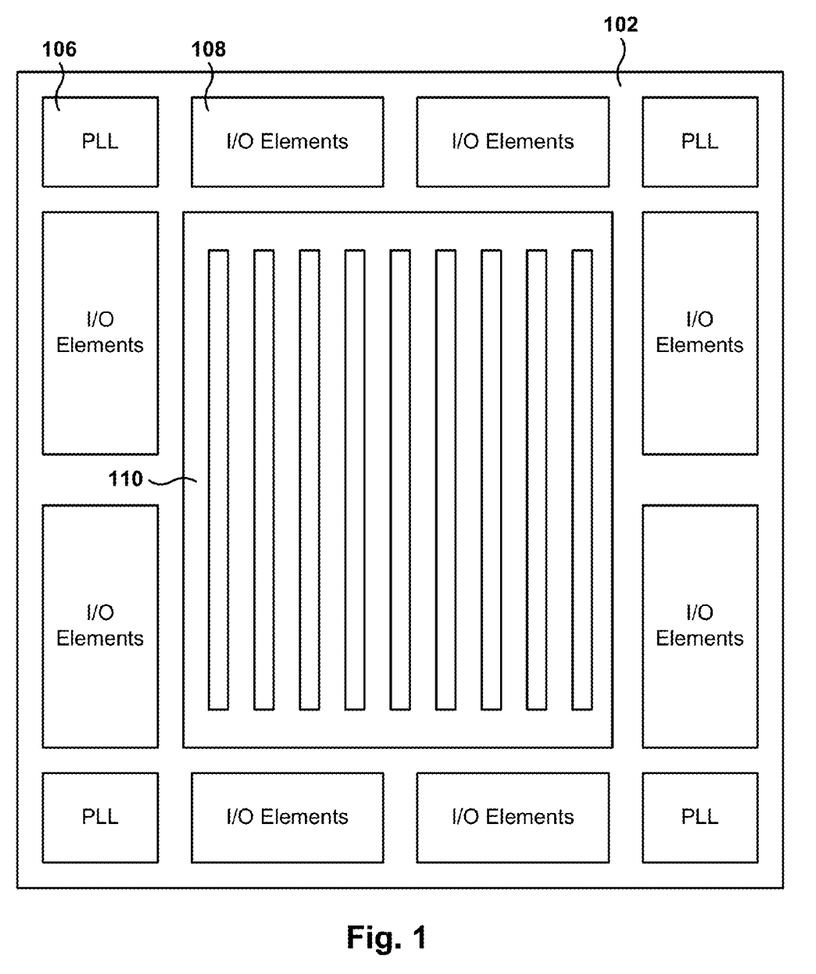
FIG. 1 shows a simplified block diagram of a Programmable Logic Device (PLD) that can include aspects of the exemplary embodiments.

FIG. 1 shows a simplified block diagram of a Programmable Logic Device (PLD) that can include aspects of the exemplary embodiments. PLD 102 includes logic region 110 and Input/Output (I/O) elements 108. I/O elements 108 may support a variety of I/O interfaces. Other auxiliary circuits, such as Phase-Locked Loops (PLLs) 106 for clock generation and timing, can be located outside core logic region 110, e.g., at corners of programmable device 102 and adjacent to I/O elements 108. Logic region 110 may be populated with logic cells which include, among other things, at the most basic level, "logic elements" (LEs), or at a more complex level, programmable Intellectual Property (IP) blocks. LEs may include look-up table-based logic regions and the LEs may be grouped into "Logic Array Blocks" (LABs). The logic elements and groups of logic elements or LABs can be configured to perform logical functions desired by the user.

Figure 2:
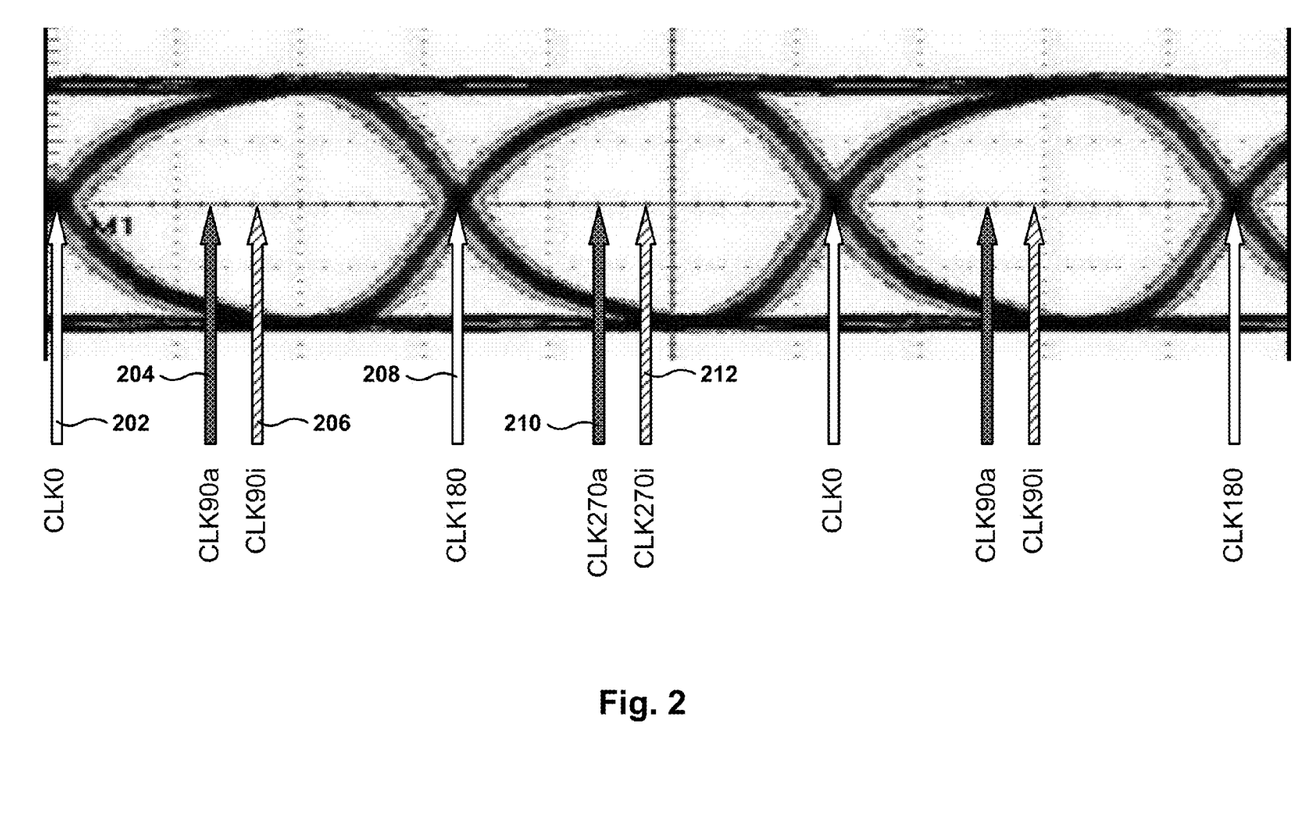
FIG. 2 illustrates the sampling of a data signal using clock signals with different clock phases, according to one embodiment.

FIG. 2 illustrates the sampling of a data signal using clock signals with different clock phases, according to one embodiment. A bit stream includes binary-coded pulse signals, represented by zeros and ones, created by the electronic circuit and monitored with an oscilloscope. The signal displayed on the oscilloscope that results from the bit streams is referred to as an "eye diagram", such as the one in FIG. 2.

The eye diagram is made from thousands of voltage samples, taken over a period of time, that reveal the quality of the measured bit streams. In an eye diagram, the high and low states of the signal appear as substantially horizontal traces across the oscilloscope screen. State transitions are not completely random. Each transition potentially occurs relative to a conversion clock signal. Thus, if a state transition occurs, the transition happens at a known time relative to the conversion clock signal. By triggering the oscilloscope with the conversion clock signal, the state transitions of the communication signal appear at substantially the same locations on the oscilloscope display. The resulting pattern is an open area, the eye, bounded on the top and bottom by the high and low state levels, respectively, and on each side by state transition traces. The state transitions on each side of the opening generally cross and form an "X" shape on each side of the eye. One component of each "X" shape corresponds to high-to-low transitions and the other component corresponds to low-to-high transitions. The distance between the high and low states, the slope of the state transition, the overall size of the open area, and other similar measurements aid in characterizing the operation of the electronic circuit producing the eye pattern.

Embodiments described herein reduce input clock phase spacing error of phase interpolators (or mixers) in interpolator-based Clock-Data Recovery circuits (iCDR). When using ideal clocks in a system with four clock signals, data transitions are detected using two opposing clock signals, such as CLK0 202 and CLK180 208, and data is sampled using the clock signals having phases between CLK0 and CLK180, such as CLK90$i$ 206 and CLK270$i$ 212. If the clocks are equally spaced in phase, CLK90$i$ 206 and CLK270$i$ sample at the center of the eye, where the eye height is maximum or near maximum. Two clocks with phases about 90° apart are sometimes referred to as an I-clock (in-phase clock) and a Q-clock (quadrature clock), where the Q-clock has a phase lag of 90° relative to the I-clock.

Due to clock phase spacing error, the actual sampling signals CLK90$a$ 204 and CLK270$a$ 210 deviate from the optimum sampling points. This error impairs the receiver's ability to recover jittery data that does not have an adequate eye opening. The small difference is enough to cause deviations from the ideal case, and the system may not able to align the clock in the middle of the eye, resulting in a higher-than-expected bit error. In the embodiment of FIG. 2, CLK90$a$ 204 is closer to CLK0 202 than in the ideal case, CLK90$i$ 206. Embodiments described below reduce the clock phase error, by moving CLK90$a$ 204 further away from CLK0 202 to make CLK90$a$ 204 closer to the ideal signal CLK90$i$ 206.

It should be noted that, unless otherwise noted, clock signals described herein are named using the phase of the corresponding signal. Therefore, CLK0 202 has a clock phase of 0°, CLK90$i$ 206 has a clock phase of 90° ($i$ is for ideal clock signal), CLK270$a$ has a clock phase of 270° ($a$ is for actual clock signal), etc. In addition, signals associated with the same clock have the same name root, e.g., CLK, and are measured against the same clock phase origin, but signals associated with different clocks and that do not have the same root, may or may not be measured against the same clock phase origin. Thus, the phase of a clock signal is relevant when compared with phases of associated clock signals, but the phase does not necessarily have the same phase origin as other clock signals. For example, a module may have four input clock signals with four different clock phases, and produce four output clock signals, but the input clock signals and the output clock signals may have different phase origins. For example, a 0° output signal may be 45° away in phase from the 0° input signal, but the 0° output signal will be, in the absence of error, about 90° away in phase from the 90° output signal. Furthermore, for ease of description, the suffix x is used herein as a generic term to represent any of the clock signals with a given suffix. For example, CLKx represents, in one embodiment, any of the clock signals CLK0, CLK90, CLK180, and CLK270.

Figure 3:
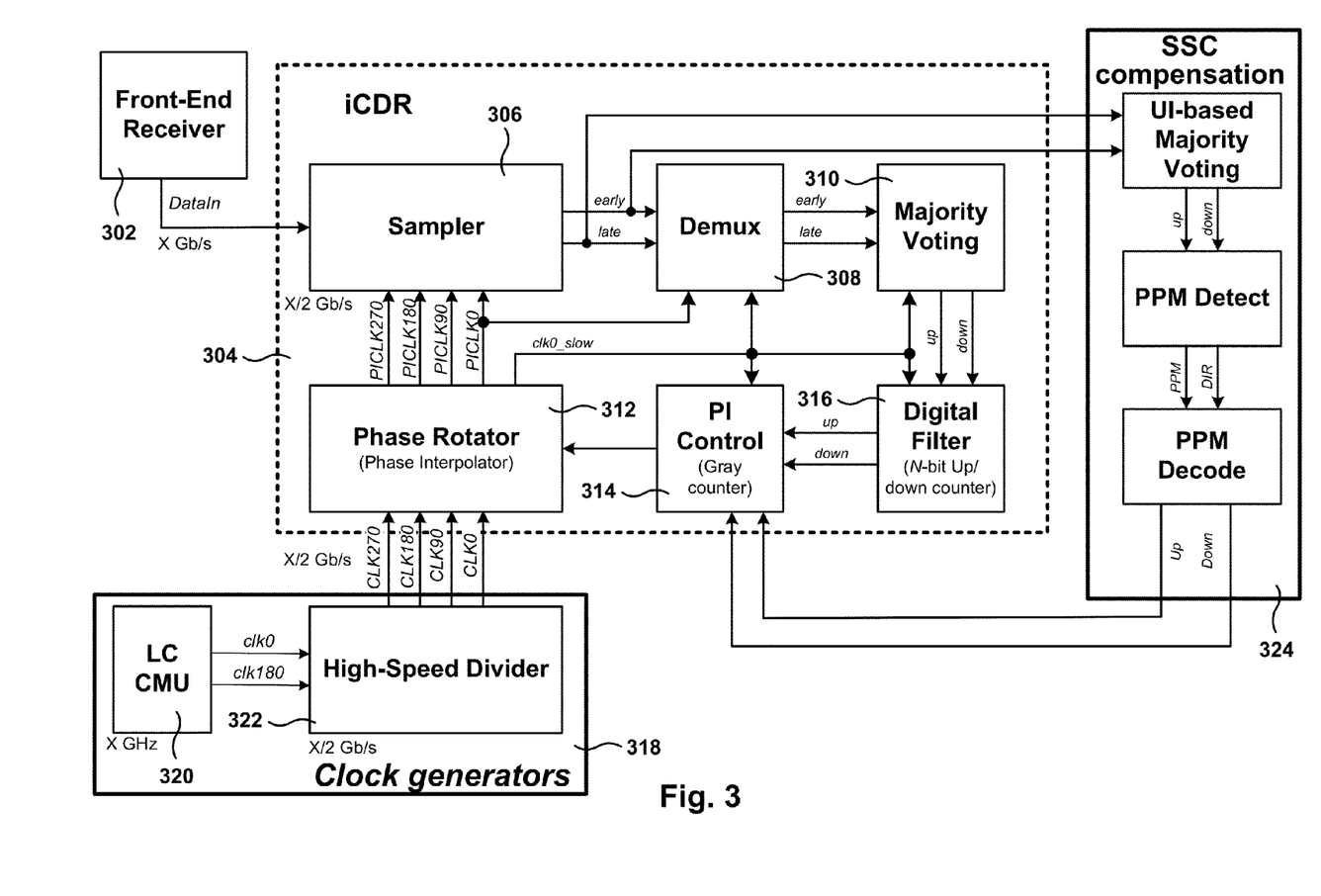
FIG. 3 is an embodiment of a circuit for sampling an incoming data signal.

FIG. 3 is an embodiment of a circuit for sampling an incoming data signal. Front end receiver 302 receives an incoming data stream transmitted as input to iCDR 304, which extracts the clock from the incoming data stream. Clock generators 318 includes a Clock Multiplication Unit (CMU) 320 with a differential LC (L represents inductance and C represents capacitance) oscillator, coupled to high-speed divider 322. The high-speed divider 322 generates four clock signals (CLK0, CLK90, CLK180, and CLK270), with phases of 0°, 90°, 180°, and 270° respectively, at one half the frequency of the input clock signals.

Phase rotator 312, also known as the Phase Interpolator (PI), rotates the phase of the incoming clock signals from clock generators 318 to generate rotated clock signals (PI-CLK0, PICLK90, PICLK180, and PICLK270) that are aligned with the transitions of the incoming data from front-end receiver 302. iCDR 304 includes a feedback loop, described in detail below, used to control how much phase rotator 312 rotates the phase of the clock signals.

Sampler 306 samples 2 bits of the incoming data at 4 evenly spaced locations. The states of the 4 sampled results indicate whether the clock is early or late, and this result is propagated through demultiplexer 308 indicating the early or late status of the clock. If the data transition is ahead of the clock edge, then the clock is late, and if the clock edge is ahead of the data, then the clock is early. Majority voting module 310 outputs up and down signals for digital filter 316, which in turn feeds PI control 314. Depending on which direction the data transition is, the majority voting circuit appraises the late and early signals to determine whether the clock phase is ahead or behind. PI control 314 produces an output to control the rotation of the clock signal in phase rotator 312. In one embodiment, Spread Spectrum Clocking (SSC) compensation circuit 324 analyzes spread spectrum clocking to generate signals for PI control 314. It should be appreciated that SSC compensation circuit 324 is optional.

As previously discussed, there may be errors in the Integrated Circuit (IC) that introduce clock phase spacing errors. The phase rotator will then propagate, and sometimes amplify, the input clock phase spacing errors if no correction is implemented. Phase rotator 312 includes circuitry to correct clock phase spacing errors, as discussed in more detail below with reference to FIGS. 4 and 5.

It should be noted that the embodiment illustrated in FIG. 3 is exemplary. Other embodiments may utilize different data alignment circuits or different module arrangements. The embodiment illustrated in FIG. 3 should therefore not be interpreted to be exclusive or limiting, but rather exemplary or illustrative.

Figure 4:
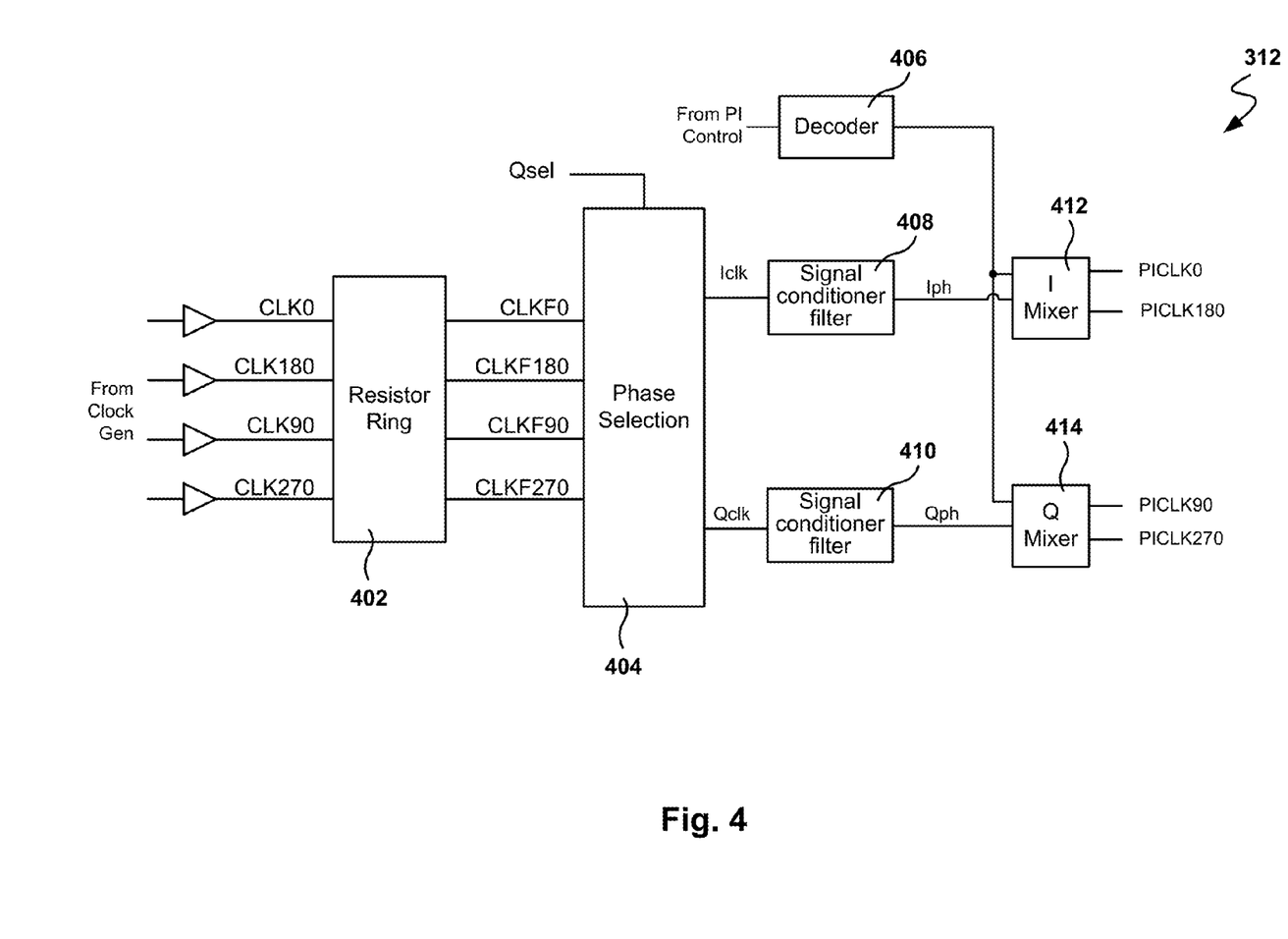
FIG. 4 is a diagram of the phase rotator circuit, in accordance with one embodiment.

FIG. 4 is a diagram of phase rotator circuit 312, in accordance with one embodiment. Resistor ring 402 is defined to correct clock phase spacing errors in incoming clock signals CLKx and produce corrected output clock signals CLKFx. More details for resistor ring circuit 402 are given below with reference to FIG. 5.

The PI circuit also includes circuits to mix output clock signals that differ by 90° and generate data-aligned clock signals having phases between the phases of the output clock signals being mixed. Phase selection block 404 selects output clocks CLKFx based on the quadrant for the desired data-aligned clock signals to be output. For example, if a data-aligned clock signal is desired with a 35° offset with reference to CLKF0, then CLKF0 and CLKF90 are mixed to obtain the signal with the 35° offset. Signal conditioner filters 408 and 410 improve the output clock signals, including the reduction of the signal amplitude and the making of the clock changes less sharp. Decoder 406 converts binary PI codes from PI control to adjust the current in mixers 412 and 414.

I mixer 412 generates complementary data-aligned clock signals PICLK0 and PICLK180, doing a weighted average of the two output clock signals, and Q mixer 414 generates PICLK90 and PICLK270. Decoder 406 provides the weights used by I mixer 412 to perform the weighted average of the two output clock signals.

Polyphase filters may be used for generating the signals for the mixers, but polyphase filters have the limitation of a limited frequency range of operation. If polyphase filters are cascaded to widen the frequency range, the amplitude is reduced at each stage. On the other hand, when using a resistor ring, only one resistor ring is needed and there are no bandwidth limitations.

Figure 5:
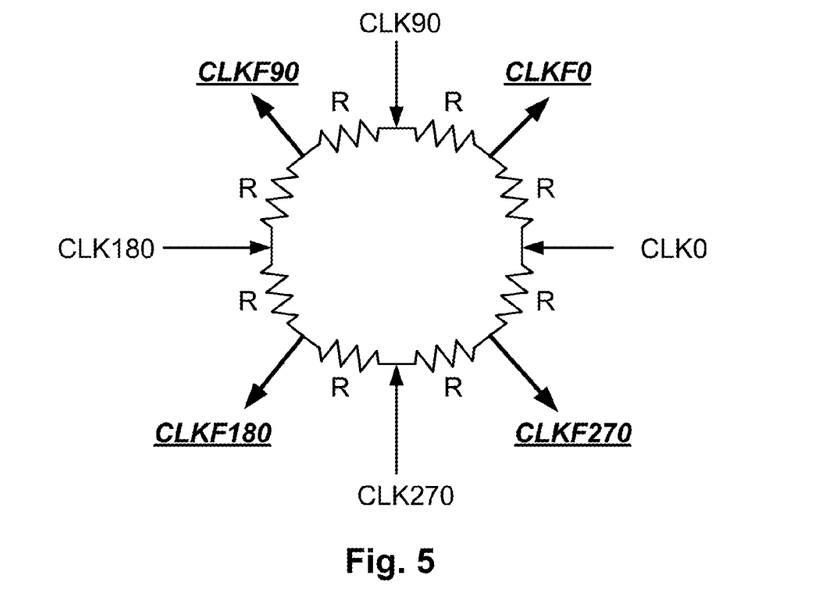
FIG. 5 illustrates an embodiment of a resistor ring for correcting the clock phases of four input clock signals.

FIG. 5 illustrates an embodiment of a resistor ring for correcting the clock phases of four input clock signals. The resistor ring includes eight resistors connected serially and forming a ring. Each of the connections between resistors is an input clock signal CLKx or an output clock signal CLKFx, with inputs and outputs alternating in the ring. Therefore, each resistor in the ring has a terminal coupled to an input line CLKx and the other terminal coupled to an output line CLKFx. The input clock signals are in sequential order, and each output clock signal has a phase between the phases of the clock signals that are connected to the output via one resistor. Thus, each output clock signal has a phase between the phases of two of the input clock signals that are successive in the ordered sequence of clock phases (0°, 90°, 180°, and 270°).

The resistor ring averages the clock phase error from two adjacent clock signals, and distributes the errors to other clock phases. In one embodiment, equal-size resistors are utilized in the ring, but in another embodiment, resistors with different values may be utilized.

As seen in FIG. 5, CLKF0 is the result of mixing of CLK0 and CLK90, CLKF90 is the result of mixing CLK90 and CLK180, etc. In the case where CLK0 and CLK90 have no error, the resulting CLKF0 is 45° off from both CLK0 and CLK90. In addition, the amplitude of the clock signal CLKF0 is about seventy percent $$\sqrt{2} \quad (2)$$

the amplitude of CLK0 or CLK90, because the result of combining two sine signals that are 90° apart using two resistors is another sine signal, which has an amplitude of $$\frac{\sqrt{2}}{2}$$

that of the signals being combined and a phase that is the average of the phases of the signals being combined.

For illustration purposes, error correction is described below for a case when signals CLK0, CLK180, and CLK270 are ideal, and signal CLK90 is at 80°, instead of 90°, having a 10° phase error. The phases of the output clock signals, with reference to the phase of the input clock signals, would be calculated as follows:

CLKF0 would be 40°, or ½ (0°±80°.
CLKF90 would be 130°, or ½ (80°±180°.
CLKF180 would be 225°, or ½ (180°±270°.
CLKF270 would be 315°, or ½ (270°±360°.

The clock phase spacing between each the output clock signals CLKFx is as follows:

CLKF0~CLKF90=90°, or 130°-40°.
CLK90~CLK180=95°, or 225°-130°.
CLK180~CLK270=90°, or 315°-225°.
CLK270~CLK0=85°, or)(360°±40°-315°.

The maximum clock phase spacing deviation from 90° for each CLKFx pair is 5°, which is half of the clock phase spacing error of 10° on the input clocks. In one embodiment, additional resistor rings can be chained serially to further decrease the clock phase error. For example, if a second resistor ring were added, the clock phase error would be further reduced to 2.5°. However, additional circuitry may be needed to accommodate for the decrease in the amplitude of the clock signals output from each resistor ring where multiple resistor rings are incorporated.

Figure 6:
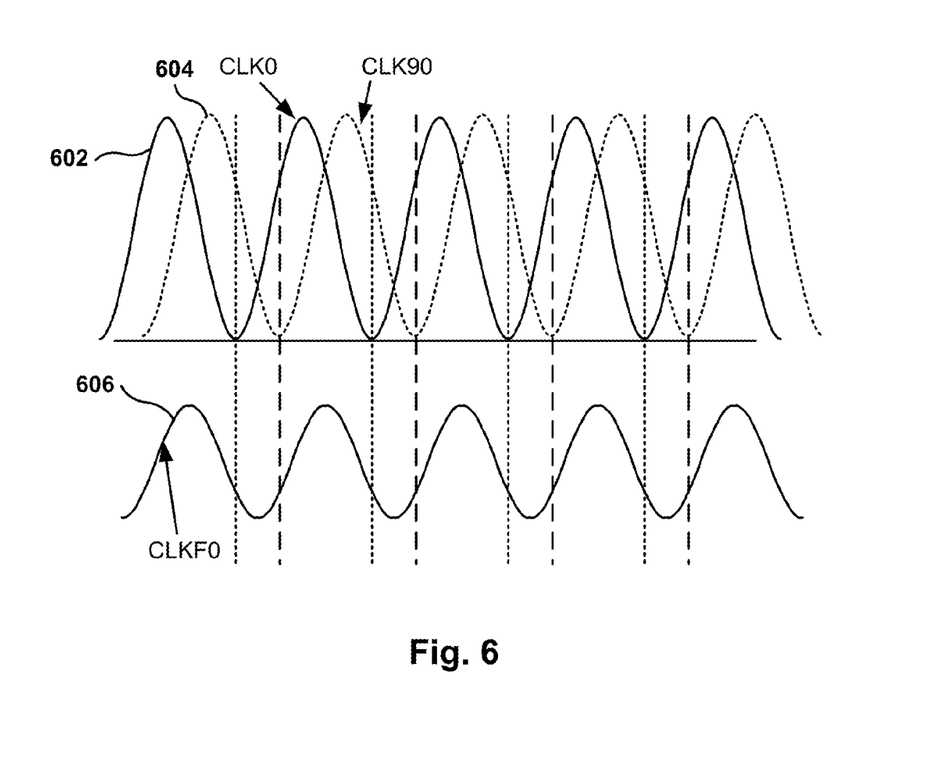
FIG. 6 illustrates the waveforms of clock signals before and after correction of the clock phase, according to one embodiment.

FIG. 6 illustrates the waveforms of clock signals before and after correction of the clock phase, according to one embodiment. FIG. 6 illustrates how the output clock signals have a phase that is between the resistor-ring adjacent clock signals. CLK0 wave signal 602 is 90° away in phase from CLK90 wave signal 604. Because CLKF0 is connected to both CLK0 and CLK90, via respective resistors in the resistor ring, CLKF0 has a phase that is between CLK0 and CLK90. In the ideal case shown in FIG. 6 where CLK0 and CLK90 have no phase error, the resulting CLKF0 is 45° off phase from both signals CLK0 and CLK90.

The use of the resistor ring offers better results than using polyphase filters because the correction bandwidth is wide since resistors are not frequency dependent. The layout is more compact because resistors are usually smaller than capacitors. Also, resistors can be matched relatively well in silicon due to the smaller number of processing steps required than when using transistors. The clock phase spacing error reduction can be as much as 50% in one embodiment with this ring structure.

Figure 7:
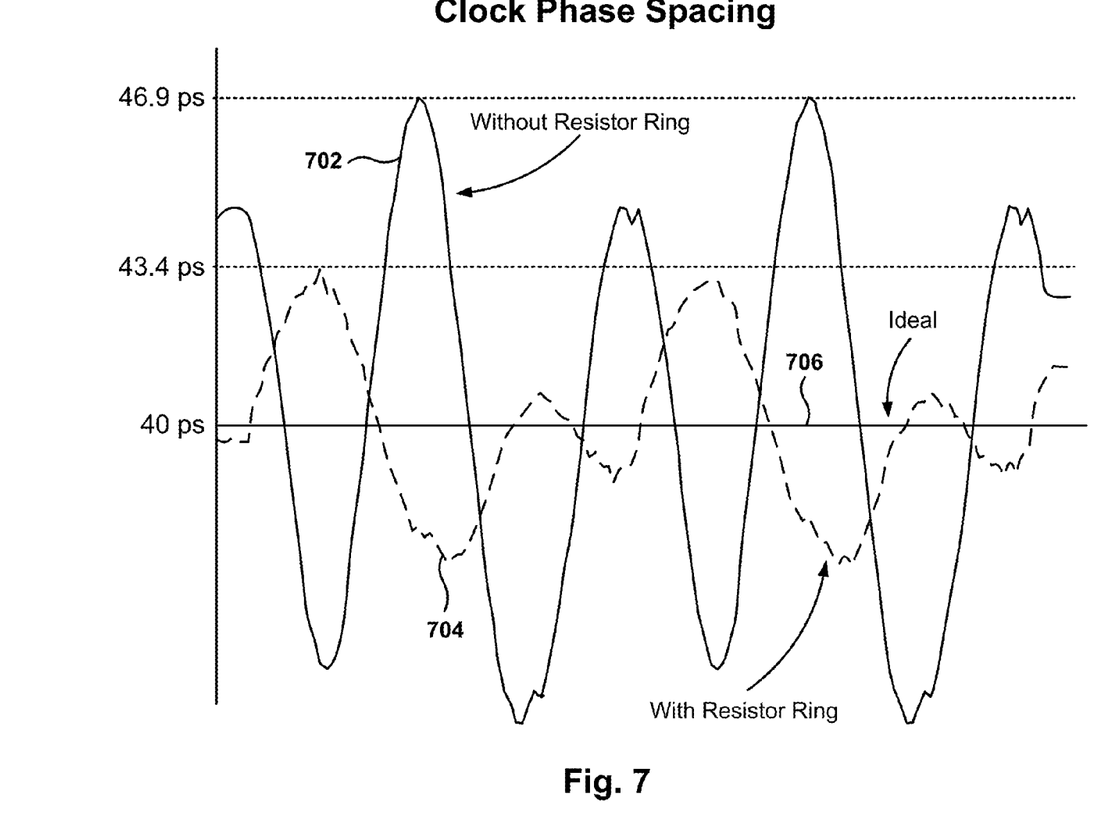
FIG. 7 shows a measurement of the correction of a clock phase, according to one embodiment.

FIG. 7 shows a measurement of the correction of a clock phase, according to one embodiment. With input clocks at 6.25 GHz, the clock period is 160 ps, and the clock signals are spaced 40 ps. In FIG. 7, the ideal case, with no phase errors, the signals are spaced 40 ps 706. In the example of FIG. 7, clock signal 702 has a phase error of about 6.9 ps, as the clock phase spacing reaches up to a maximum of 46.9 ps. Clock signal 702 corresponds to the clock signal without the resistor ring.

When a resistor ring is utilized, the resulting clock phase signal 704 has a phase error of about 3.4 ps, as the clock phase spacing reaches up to a maximum of 43.4 ps. Thus, in this embodiment, the resistor ring has reduced PI output clock phase spacing error from ±6.9 ps to ±3.4 ps.

Figure 8:
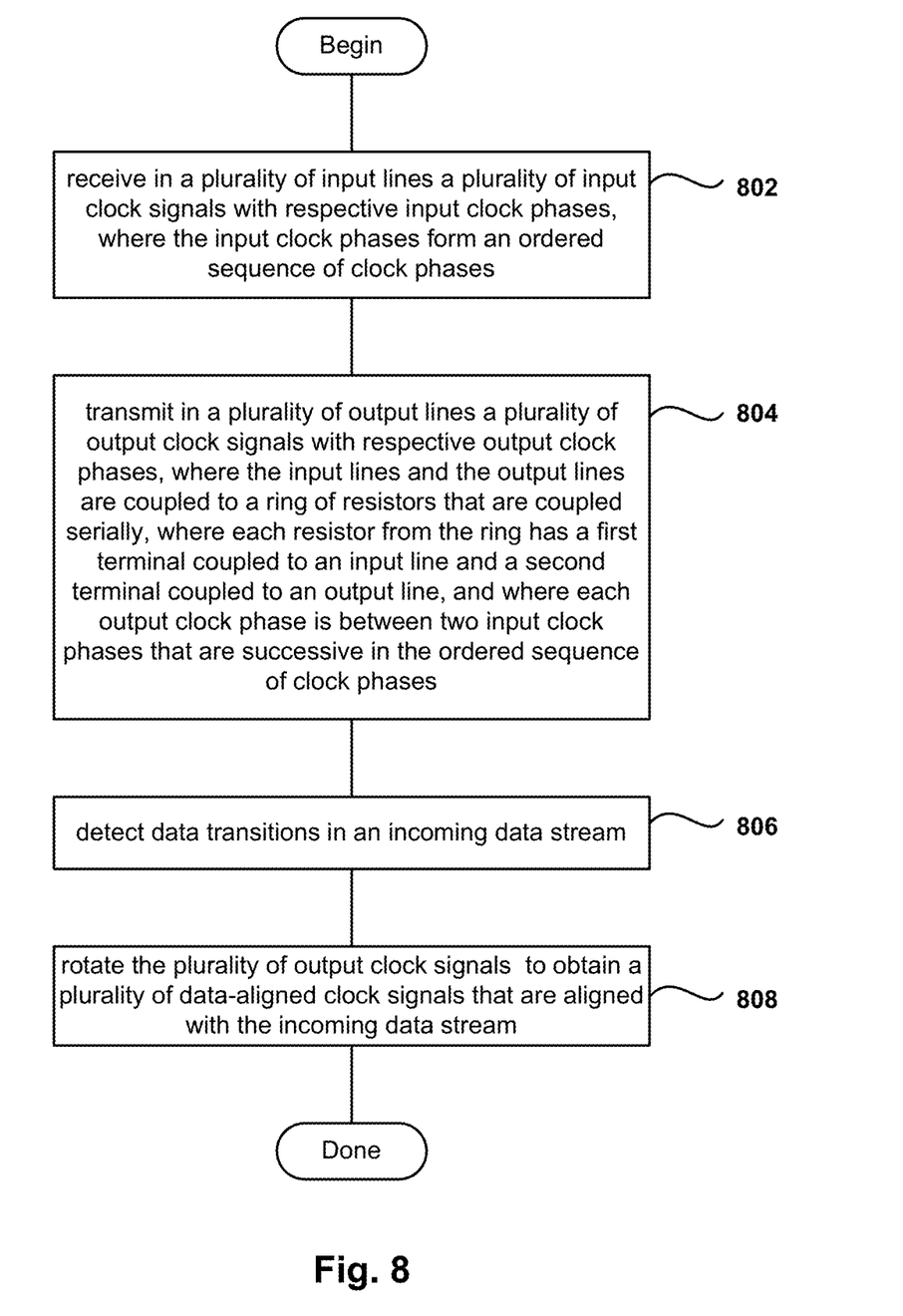
FIG. 8 is a flowchart illustrating method operations for correcting the phase of a clock signal, in accordance with one embodiment.

FIG. 8 is a flowchart illustrating method operations for correcting the phase of a clock signal, in accordance with one embodiment. In operation 802, a plurality of input clock signals, with respective input clock phases, are received in a plurality of input lines. The input clock phases form an ordered sequence of clock phases. See for example, CLKx signals of FIG. 4 received by resistor ring 402.

Further, in operation 804, a plurality of output clock signals with respective output clock phases, are transmitted in a plurality of output lines. The input lines and the output lines are coupled to a ring of resistors that are coupled serially, where each resistor from the ring has a first terminal coupled to an input line and a second terminal coupled to an output line. See for example the resistor ring of FIGS. 4 and 5. Each output clock phase is between two input clock phases that are successive in the ordered sequence of clock phases. See for example, CLKF0 606 of FIG. 6 that has a phase between CLK0 602 and CLK90 604.

In operation 806, data transitions are detected in an incoming data stream. Further, in operation 808, the plurality of output clock signals are rotated to obtain a plurality of data-aligned clock signals that are aligned with respect to the incoming data stream.

The embodiments, thus far, were described with respect to integrated circuits and PLDs. The method and apparatus described herein may be incorporated into any suitable circuit. For example, the method and apparatus may be incorporated into numerous types of devices such as microprocessor or programmable logic devices. Exemplary of programmable logic devices include Programmable Arrays Logic (PALs), Programmable Logic Arrays (PLAs), Field Programmable Logic Arrays (FPLAs), Electrically Programmable Logic Devices (EPLDs), Electrically Erasable Programmable Logic Devices (EEPLDs), Logic Cell Arrays (LCAs), Field Programmable Gate Arrays (FPGAs), Application Specific Standard Products (ASSPs), Application Specific Integrated Circuits (ASICs), just to name a few. Some embodiments are particularly advantageous when implemented in a PLD, because the embodiments provide extra flexibility with respect to the wide range of inputs that the PLD might utilize according to customer design.

The programmable logic device described herein may be part of a data processing system that includes one or more of the following components; a processor; memory; input/output circuits; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by the assignee.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relate to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A method for correcting a phase of a clock signal, the method comprising:
   receiving from a plurality of input lines, a plurality of input clock signals with respective input clock phases, the input clock phases forming an ordered sequence of clock phases;
   transmitting over a plurality of output lines, a plurality of output clock signals with respective output clock phases, wherein the plurality of input lines and the plurality of output lines are coupled to a serially coupled ring of resistors, wherein each resistor from the ring has a first terminal coupled to an input line and a second terminal coupled to an output line, and wherein each output clock phase is between successive input clock phases of the ordered sequence of clock phases;
   detecting data transitions in an incoming data stream; and
   combining the plurality of output clock signals to obtain a plurality of data-aligned clock signals that are aligned with the incoming data stream.

2. The method as recited in claim 1, wherein the ordered sequence of clock phases is a circular sequence, and wherein the output clock phases are spaced apart in the circular sequence.

3. The method as recited in claim 2, wherein the ring of resistors includes eight resistors of equal resistance.

4. The method as recited in claim 1, wherein the ordered sequence of clock phases includes four clock phases, and wherein the successive input clock phases are about 90 degrees apart.

5. The method as recited in claim 1, wherein combining the plurality of output clock signals includes:
   determining if the incoming data stream is one of ahead or behind the plurality of output clock signals; and
   mixing pairs of output clock signals to generate the data-aligned clock signals.

6. The method as recited in claim 1, further comprising:
   applying a voting module to determine whether a clock phase is ahead or behind relative to the incoming data stream.

7. A circuit for correcting a phase of a clock signal, the circuit comprising:
   a plurality of input lines operable to transmit a plurality input clock signals having respective input clock phases, the input clock phases forming an ordered sequence of clock phases;
   a plurality of output lines operable to transmit a plurality of output clock signals with respective output clock phases;
   a plurality of resistors coupled serially and forming a ring, wherein each resistor has a first terminal coupled to an input line and a second terminal coupled to an output line, and wherein each output clock phase is between successive input clock phases of the ordered sequence of clock phases; and
   a spread spectrum compensation module operable to control a rotation of the output clock signals based on spread spectrum signals of an incoming data stream.

8. The circuit of claim 7, further including:
   a mixer being operable to generate data-aligned clock signals by performing a weighted average of two output clock signals, wherein the data-aligned clock signals are aligned with an incoming data stream.

9. The circuit of claim 8, further including:
   a decoder coupled to the mixer, the decoder operable to provide the mixer with information associated with weights for performing the weighted average.

10. The circuit of claim 7, further including:
    a phase selection module coupled to both the plurality of output lines and a select input, the phase selection module operable to mix output clock signals to produce data-aligned clock signals aligned with an incoming data stream.

11. The circuit of claim 7, further including:
    a clock generator coupled to the plurality of input lines, the clock generator operable to transmit the input clock signals.

12. The circuit of claim 7, further including:
    a sampler operable to detect data transitions in an incoming data stream, wherein the output clock signals are combined to generate data-aligned clock signals that are aligned with the incoming data stream.

13. The circuit of claim 7, wherein the ordered sequence of clock phases is a circular sequence, and wherein the output clock phases are spaced apart in the circular sequence.

14. The circuit of claim 7, further including:
    an additional plurality of resistors forming an additional ring that is coupled to the output lines of the ring.

15. A circuit for correcting a phase of a clock signal, the circuit comprising:
    multiple input lines operable to receive multiple input clock signals with input clock phase values that are sequential and approximately equally spaced apart within the sequence;
    multiple output lines operable to transmit output clock signals with respective output clock phase values;
    multiple resistors coupled serially and forming a ring, wherein each resistor has a first terminal coupled to an input line and a second terminal coupled to an output line, wherein each of the output clock phase values is between successive input clock phases values of the sequence, and wherein each output clock phase value is different in phase from a corresponding input clock phase; and
    a mixer operable to generate data-aligned clock signals by performing a weighted average of two output clock signals, wherein the data-aligned clock signals are aligned with an incoming data stream.

16. The circuit of claim 15, wherein the circuit includes four input lines, four output lines, and eight resistors, wherein the input clock phase values are spaced apart by approximately 90 degrees, and wherein each of the output clock phase values is about 45 degrees different in phase from a corresponding input clock phase value.

17. The circuit of claim 15, further including:
    a phase selection module coupled to the output lines and coupled to a select input, the phase selection module operable to output clock signals to be mixed in order to produce data-aligned clock signals that are aligned with an incoming data stream.

18. The circuit of claim 15, further including:
    a clock generator coupled to the input lines, the clock generator operable to transmit the input clock signals.

19. The circuit of claim 15, further including:
    a sampler operable to detect data transitions in an incoming data stream, wherein the output clock signals are combined to generate data-aligned clock signals that are aligned with the incoming data stream.

20. The circuit of claim 15, further including:
    an additional plurality of resistors forming an additional ring that is coupled to the output lines of the ring.

* * * * *